US010818514B1

(12) United States Patent
Christensen

(10) Patent No.: US 10,818,514 B1
(45) Date of Patent: Oct. 27, 2020

(54) FINE WIRE MANIPULATOR

(71) Applicant: Triad National Security, LLC, Los Alamos, NM (US)

(72) Inventor: Kyle B. Christensen, Los Alamos, NM (US)

(73) Assignee: Triad National Security, LLC, Los Alamos, NM (US)

( * ) Notice: Subject to any disclaimer, the term of this patent is extended or adjusted under 35 U.S.C. 154(b) by 252 days.

(21) Appl. No.: 16/033,068

(22) Filed: Jul. 11, 2018

Related U.S. Application Data

(60) Provisional application No. 62/532,845, filed on Jul. 14, 2017.

(51) Int. Cl.
 *H01L 21/48* (2006.01)
 *H01L 23/00* (2006.01)
 *B23K 20/04* (2006.01)

(52) U.S. Cl.
 CPC .......... *H01L 21/4825* (2013.01); *H01L 24/78* (2013.01); *B23K 20/04* (2013.01)

(58) Field of Classification Search
 CPC ......... Y01T 29/49162; Y01T 29/49179; Y01T 403/151; H01L 21/4825; H01L 24/78; B23K 20/004; F42B 3/12
 USPC ...................... 313/623; 102/202.7; 228/180.5
 See application file for complete search history.

(56) References Cited

U.S. PATENT DOCUMENTS

| | | | | | |
|---|---|---|---|---|---|
| 3,628,716 | A | * | 12/1971 | Fastre ................. | B23K 20/106 228/1.1 |
| 4,434,347 | A | * | 2/1984 | Kurtz ................. | H01L 21/4825 219/56.22 |
| 5,152,450 | A | * | 10/1992 | Okikawa .............. | B23K 20/007 228/180.5 |
| 5,294,038 | A | * | 3/1994 | Nakano ................ | B23K 20/007 228/179.1 |
| 5,433,371 | A | * | 7/1995 | Morisako ............. | B23K 20/004 228/180.5 |
| 5,566,876 | A | * | 10/1996 | Nishimaki ............. | H01L 24/78 228/102 |
| 2005/0176178 | A1 | * | 8/2005 | Takahashi ........... | H01L 21/4853 438/123 |

* cited by examiner

*Primary Examiner* — Christopher M Raabe
(74) *Attorney, Agent, or Firm* — Klarquist Sparkman, LLP

(57) ABSTRACT

A system for manipulating a filament can include a filament supply from which a filament can be drawn, the filament supply being positioned along an axis, a vacuum manipulator assembly positioned along the axis, wherein the vacuum manipulator assembly is configured to engage the filament when a vacuum is drawn through the vacuum manipulator assembly and draw the filament along the axis to a workpiece, and a welding tool comprising a welding head positioned along the axis between the filament supply and the vacuum manipulator assembly, the welding tool being configured to weld the filament to the workpiece.

20 Claims, 8 Drawing Sheets

FINE WIRE MANIPULATOR

CROSS-REFERENCE TO RELATED APPLICATIONS

This application claims the benefit of U.S. Provisional Application No. 62/532,845, filed on Jul. 14, 2017, which is incorporated by reference herein in its entirety.

ACKNOWLEDGEMENT OF GOVERNMENT SUPPORT

This invention was made with government support under Contract No. DE-AC52-06NA25396 awarded by The U.S. Department of Energy. The government has certain rights in the invention.

FIELD

The disclosure relates to systems and methods for precisely and accurately positioning a filament along an axis with respect to a workpiece, and securing the filament to the workpiece.

BACKGROUND

Detonators such as exploding-bridgewire detonators include a header having two spaced apart electrodes and a thin conductive wire extending between and welded to the electrodes. When a current is supplied to the exploding-bridgewire detonator, the wire vaporizes, producing a shock and heat. The shock and heat produced by the vaporized wire can be used to initiate an explosive charge with precise, predictable timing. The wires used in exploding-bridgewire detonators typically have a small diameter (e.g., 10 μm to 100 μm), and must be precisely positioned on the electrodes in order to function within exacting timing specifications. Existing systems for building exploding-bridgewire detonators typically require a worker to manually locate the wire on the electrodes using, for example, grippers or tweezers. This process can be extremely time-consuming, and can result in positional errors in the location of the wire. Moreover, manipulating the wire with tweezers or other tools may damage the wire, which can affect the timing of the detonator. Accordingly, a need exists for improved systems for manipulating small diameter wires.

SUMMARY

Described herein are embodiments of a system and method for accurately and precisely positioning a filament over a workpiece. The system and method can also be used to weld the filament to the workpiece, and to measure the resistance across the workpiece/filament assembly.

In a representative embodiment, a system for manipulating a filament can comprise a filament supply from which the filament can be drawn and a vacuum manipulator assembly. The vacuum manipulator assembly can include a tubular manipulator member having a needle tip member coupled to an end portion thereof, the tubular manipulator member being movable along an axis between a first position and a second position. The system can further comprise a tubular guide member located between the filament supply and the vacuum manipulator assembly, and a welding tool. The filament can be drawn through the tubular guide member and the tubular guide member can be positioned such that a lumen of the tubular guide member is oriented along the axis. The welding tool can include a welding head positioned along the axis between the tubular guide member and the vacuum manipulator assembly and configured to weld the filament to a workpiece. The vacuum manipulator assembly can be configured such that when the tubular manipulator member is at the second position, the needle tip member is located adjacent the tubular guide member and configured to engage the filament when a vacuum is drawn through the tubular manipulator member. The vacuum manipulator assembly can be further configured such that motion of the tubular manipulator member toward the first position draws the filament along the axis from the filament supply, through the tubular guide member, and to the workpiece for welding by the welding tool.

In some embodiments, the tubular manipulator member can be coupled to a guide assembly comprising a shuttle member movably mounted to a rail member. Motion of the shuttle member along the rail member can produce corresponding motion of the needle tip member along the axis between the first position and the second position.

In some embodiments, the system further comprises an electrode assembly comprising a first electrode having a first angled member and a second electrode having a second angled member. The first and second electrodes can be spaced apart from the welding tool such that a workpiece can be positioned between the welding tool and the electrodes. The first angled member can extend toward the welding head and comprise a first contact surface and the second angled member can extend toward the welding head and comprise a second contact surface. The first and second contact surfaces can be spaced apart from one another along the axis.

In some embodiments, the first electrode can comprise a third angled member adjacent the first angled member. The third angled member can extend toward the welding head and comprise a third contact surface. The second electrode can comprise a fourth angled member adjacent the second angled member. The fourth angled member can extend toward the welding head and comprise a fourth contact surface. The third and fourth contact surfaces can be spaced apart from one another along the axis.

In some embodiments, the electrode assembly is configured to measure a resistance across the filament and the workpiece when the filament is welded to the workpiece.

In some embodiments, the workpiece can be an exploding-bridgewire detonator.

In some embodiments, the welding head can comprise two adjacent welding electrodes configured to perform parallel gap welding.

In another representative embodiment, a system can comprise a filament supply from which a filament can be drawn, the filament supply being positioned along an axis. The system can further comprise a vacuum manipulator assembly positioned along the axis, a welding tool, and an electrode assembly. The vacuum manipulator assembly can be configured to engage the filament when a vacuum is drawn through the vacuum manipulator assembly and draw the filament along the axis to a workpiece. The welding tool can comprise a welding head positioned along the axis between the filament supply and the vacuum manipulator assembly and can be configured to weld the filament to the workpiece. The electrode assembly can comprise a first electrode having a first angled member and a second electrode having a second angled member. The first and second electrodes can be spaced apart from the welding tool such that a workpiece can be positioned between the welding tool and the electrodes. The first angled member can extend toward the welding head and comprise a first contact surface, and the second angled member can extend toward the welding head and comprise a second contact surface. The first and second contact surfaces can be spaced apart from one another along the axis.

In some embodiments, the first electrode can comprise a third angled member adjacent the first angled member, the third angled member extending toward the welding head and comprising a third contact surface. The second electrode can comprise a fourth angled member adjacent the second angled member, the fourth angled member extending toward the welding head and comprising a fourth contact surface. The third and fourth contact surfaces can be spaced apart from one another along the axis and the electrode assembly can be configured to measure a resistance across the filament and the workpiece when the filament is welded to the workpiece.

In some embodiments, the workpiece comprises first and second workpiece electrodes, and the first electrode is configured to selectively contact the first workpiece electrode and the second electrode is configured to selectively contact the second workpiece electrode.

In some embodiments, the system further comprises a switch movable between first, second, and third positions. When the switch is in the first position the system is configured to weld the filament to the first workpiece electrode. When the switch is in the second position the system is configured to weld the filament to the second workpiece electrode. When the switch is in the third position the system is enabled to measure the resistance across the filament and the workpiece.

In some embodiments, the electrode assembly is configured to use four-point resistance measurement to measure the resistance.

In some embodiments, the welding tool is configured to weld the filament to the workpiece using at least one of the first electrode and the second electrode. In some embodiments, the workpiece is an exploding-bridgewire detonator.

In some embodiments, the system can further comprise a mounting assembly configured to position the workpiece along the axis and adjacent the welding tool. The mounting assembly can comprise a plurality of extendable members configured to abut and hold the workpiece between the welding tool and the electrode assembly.

A representative method for positioning a filament can comprise inserting a filament from a filament supply through a tubular guide member oriented along an axis, and applying a vacuum to a tubular manipulator member of a vacuum manipulator assembly. The method can further comprise moving the tubular manipulator member such that a needle tip member of the tubular manipulator member moves along the axis from a first position adjacent a welding tool to a second position adjacent the tubular guide member. This causes an end portion of the filament to be drawn into the needle tip member by the vacuum. The method can further comprise moving the tubular manipulator member back to the first position such that the filament is drawn from the filament supply, through the tubular guide member, and along the axis by the needle tip member to a workpiece positioned along the axis adjacent the welding tool. The filament can then be welded to the workpiece.

In some embodiments, moving the tubular manipulator member further comprises moving a shuttle member to which the tubular manipulator member is coupled along a rail member, the rail member being oriented parallel to the axis.

In some embodiments, the filament can be a metal wire having a diameter of from 10 μm to 100 μm. In some embodiments, the workpiece can be an exploding-bridgewire detonator.

In some embodiments, the method can further comprise measuring a resistance through the filament and the workpiece using an electrode assembly. The electrode assembly can comprise a first electrode including a first angled member having a first contact surface and a second electrode including a second angled member having a second contact surface.

In some embodiments, welding the filament to the workpiece comprises using a welding head of the welding tool in combination with an electrode assembly comprising a first electrode and a second electrode.

The various innovations of this disclosure can be used in combination or separately. This summary is provided to introduce a selection of concepts in a simplified form that are further described below in the detailed description. This summary is not intended to identify key features or essential features of the claimed subject matter, nor is it intended to be used to limit the scope of the claimed subject matter. The foregoing and other objects, features, and advantages of the disclosed technology will become more apparent from the following detailed description, which proceeds with reference to the accompanying figures.

DETAILED DESCRIPTION

Figure 1:
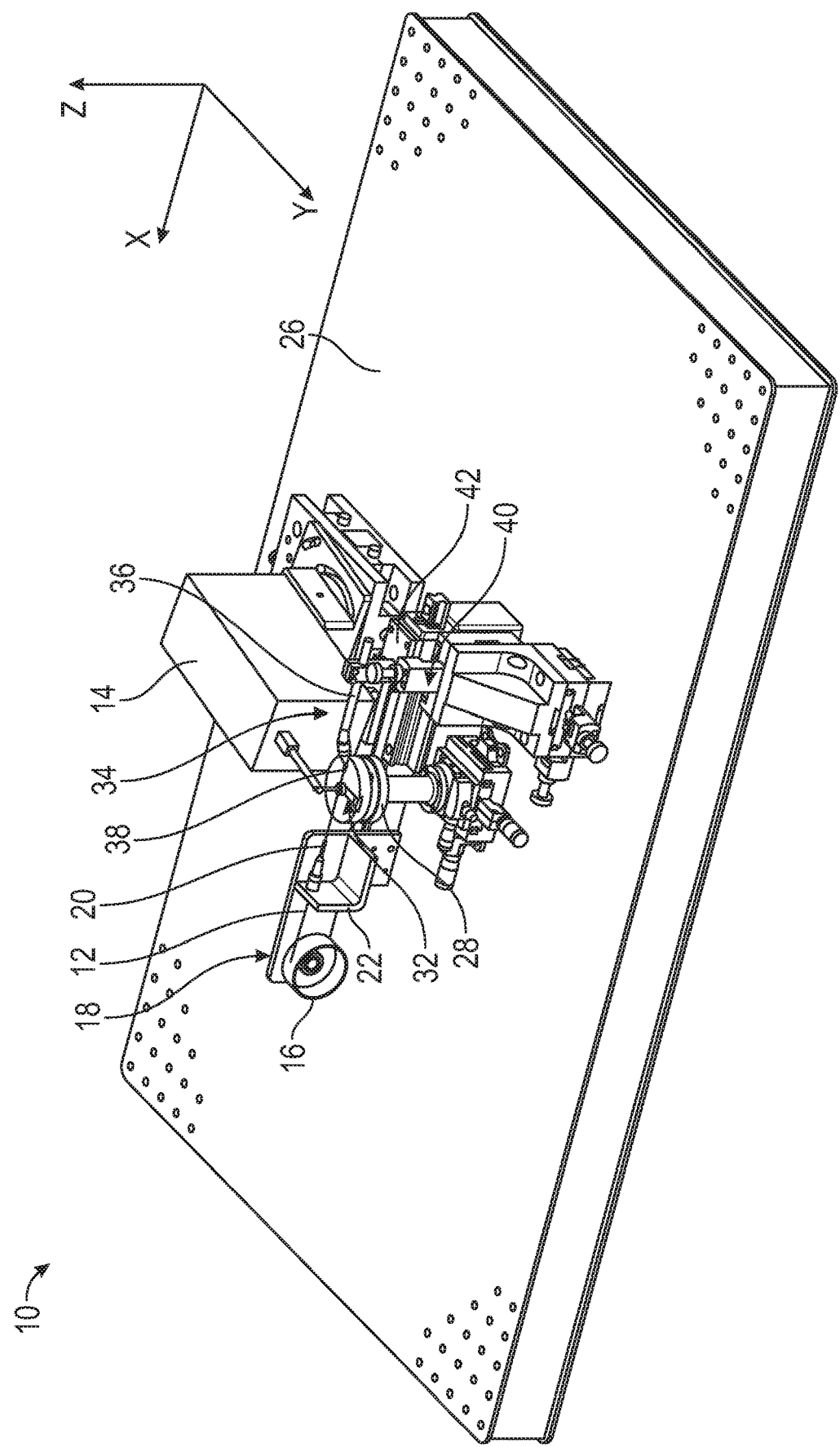
FIG. 1 is a perspective view of a representative embodiment of a system for manipulating a filament.

Described herein are embodiments of systems and methods for precisely and accurately locating a filament, such as a fine metal wire, along an axis such that the filament can be affixed to a workpiece (e.g., by welding). FIGS. 1-5 illustrate a representative embodiment of a system 10 for locating a filament 12 along an axis 24 (FIG. 2) with respect to a tool 14. In the illustrated configuration, the system comprises a filament supply configured as a reel or spool 16 on which the filament 12 is wound. The spool 16 can be rotatably coupled to a frame or jig assembly 18 such that the filament 12 can be unwound or drawn from the spool along the axis 24 through the system 10. In some embodiments, the filament 12 can be an extremely fine metal wire (e.g., made of gold, Nichrome, etc.) having a diameter of, for example, 10 µm to 100 µm.

In the illustrated embodiment, the frame assembly 18 is shown coupled to a support stage 26 (FIG. 1). The various parts of the frame assembly can be adjustable in three dimensions (note Cartesian axes shown). In other embodiments, the assembly can be situated on any suitable surface or support, or can be freestanding, depending upon the application.

Figure 2:
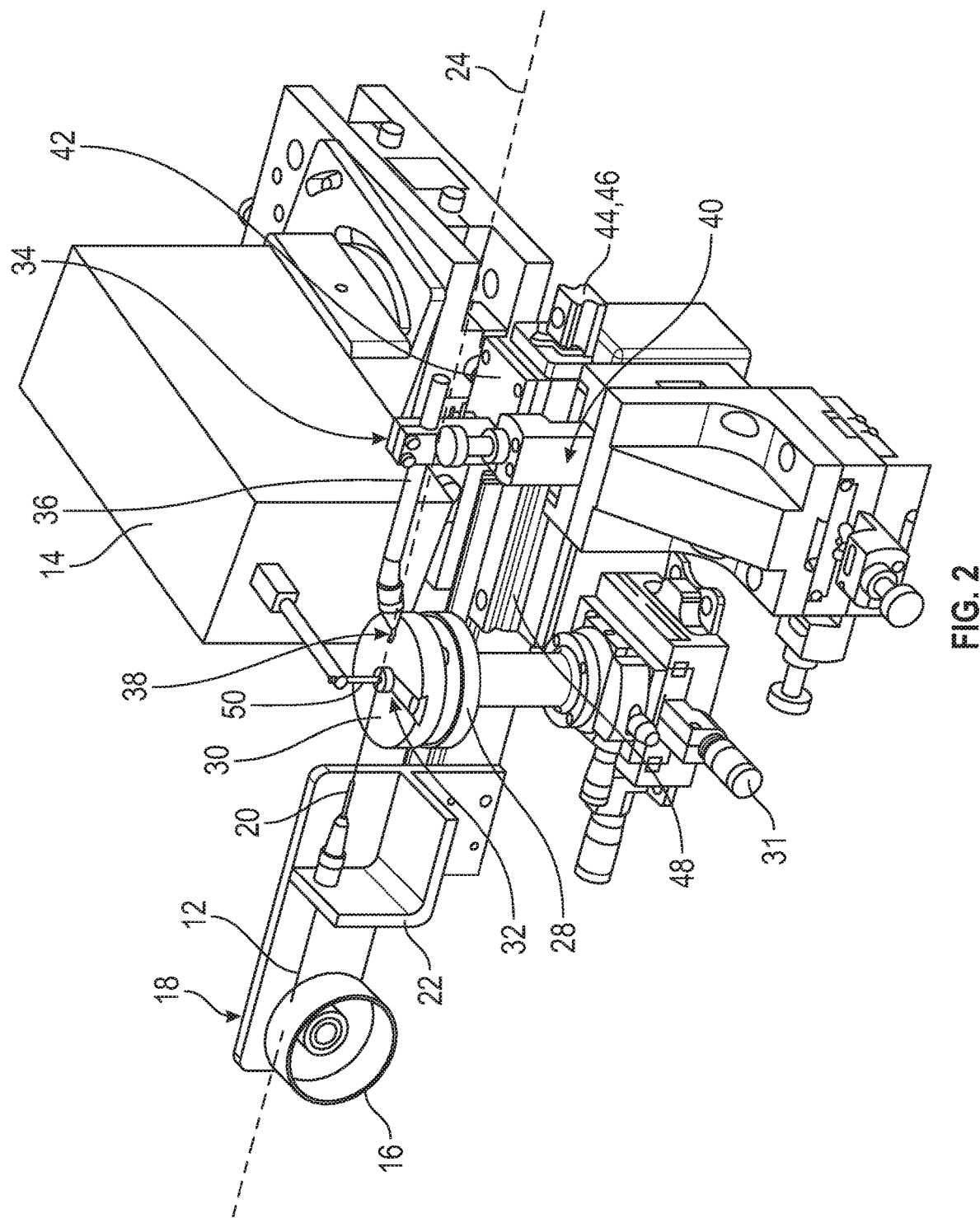
FIG. 2 is a perspective view of a portion of the system of FIG. 1.
Figure 3:
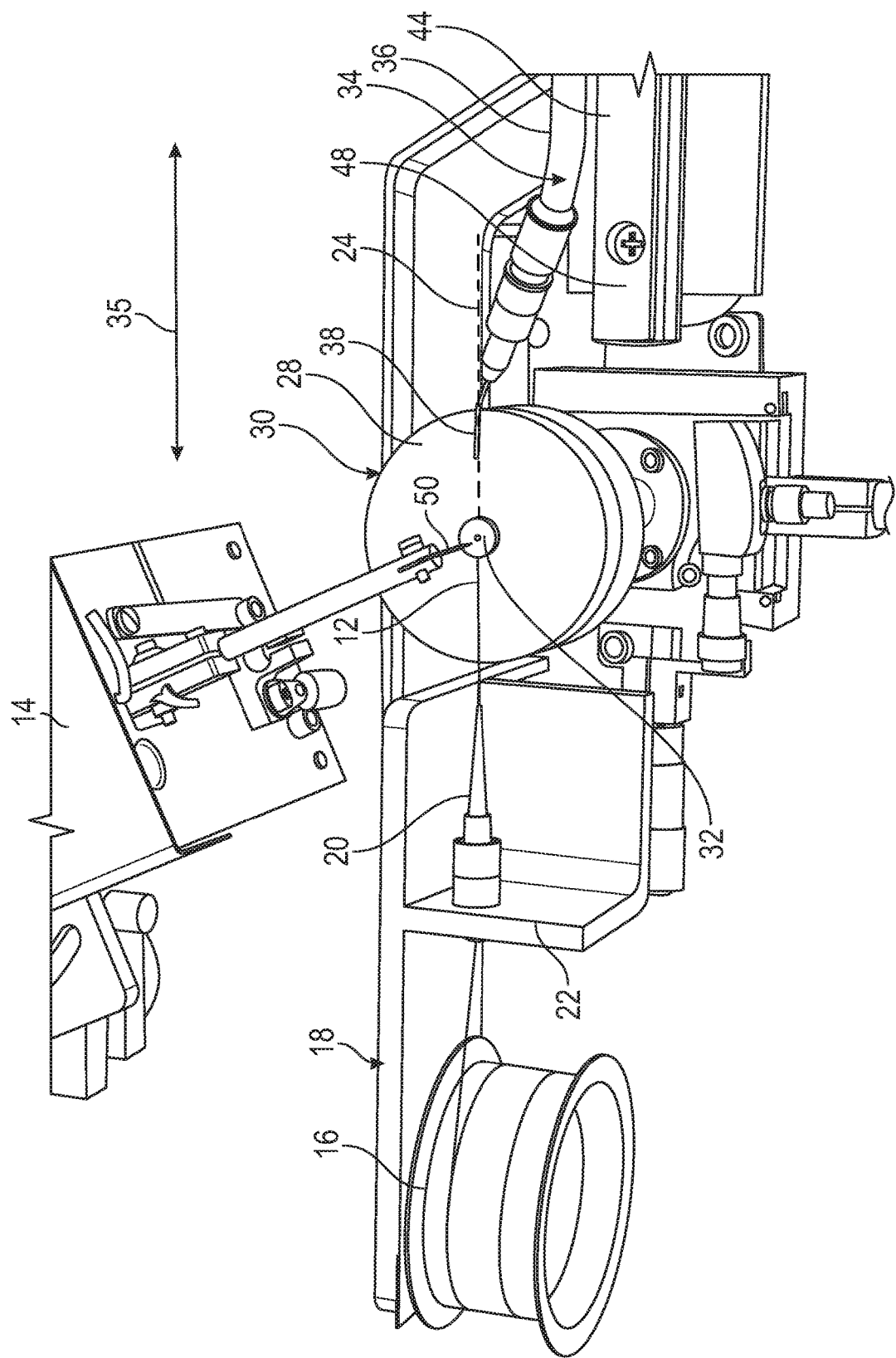
FIG. 3 is a perspective view of the system of FIG. 1 illustrating the spool, the welding tool, and the workpiece support in greater detail.

As shown in FIGS. 2 and 3, the assembly 18 can further include a filament guide configured as a tubular guide member or needle 20. The tubular guide member 20 can be coupled to a flange 22 of the frame assembly 18. The flange 22 can be oriented at a right angle to the axis 24 (and, thereby at a right angle to a longitudinal direction of the filament 12) such that the filament can be drawn from the spool 16 through a lumen of the tubular guide member 20 along the axis 24. In some embodiments, a diameter of the tubular guide member 20 can be from 0.1 mm to 1 mm.

The assembly 10 can further include a support member 28 positioned along the axis 24 and coupled to the stage 26 adjacent the tool 14. The support member 28 can include a surface 30 configured to receive a workpiece 32. In the illustrated embodiment, the position of the support member 28 relative to the other components of the system can be adjustable along the X-, Y-, and/or Z-axes using knobs such as knob 31 (FIG. 2).

Figure 4:
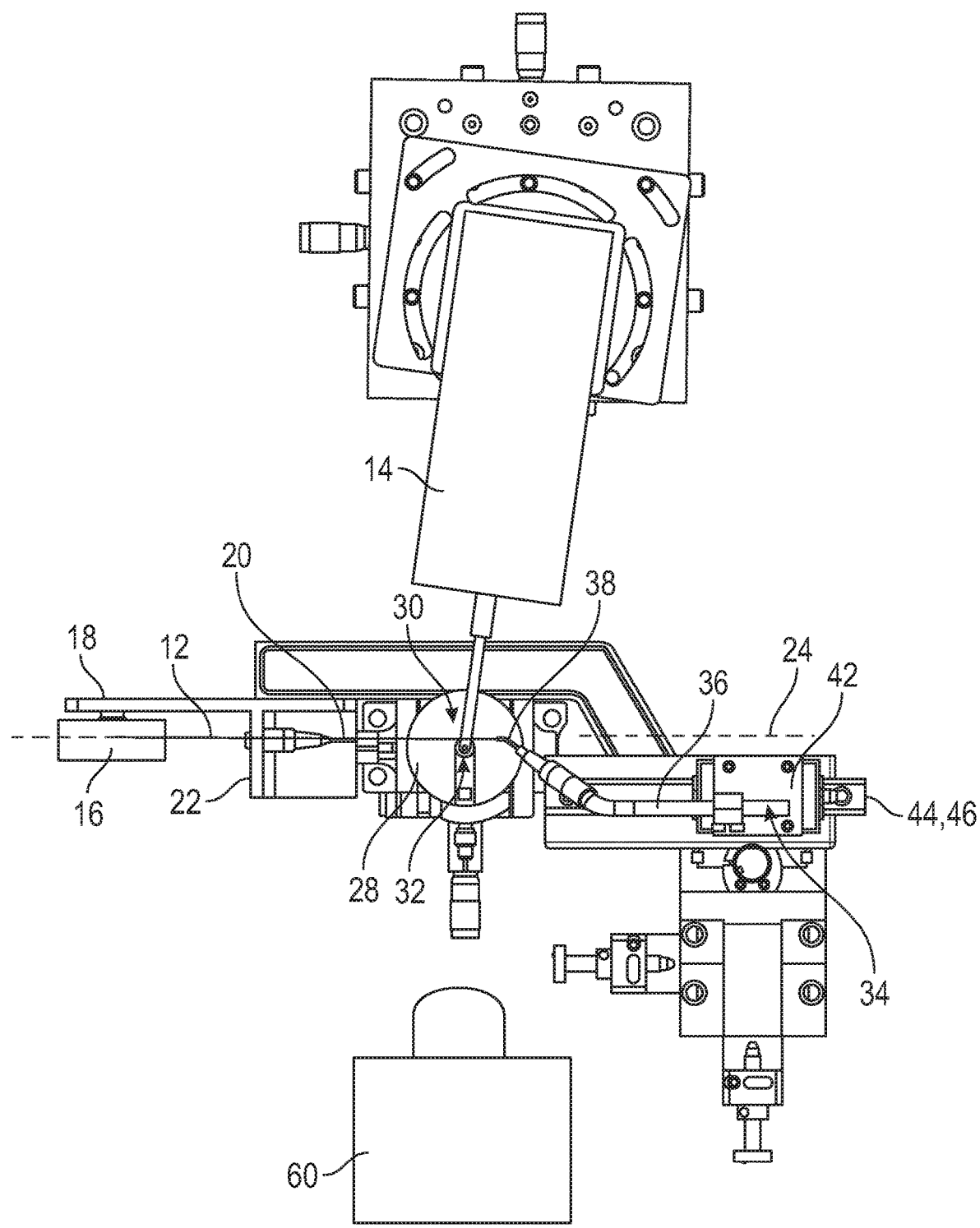
FIG. 4 is a top plan view of the embodiment of FIG. 1 including a microscope aimed at the workpiece.
Figure 5:
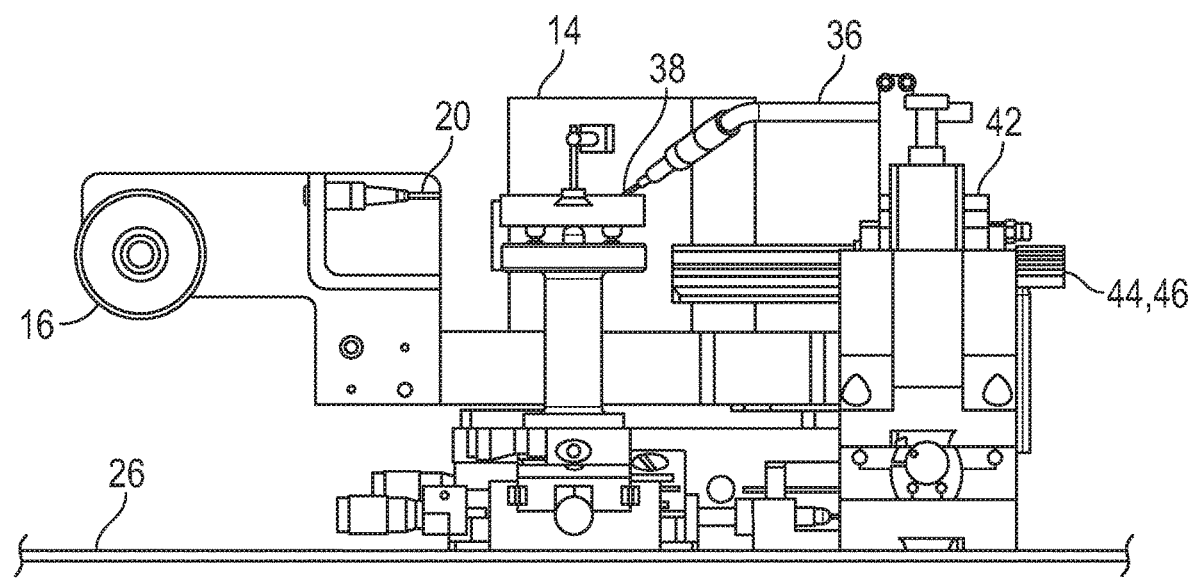
FIG. 5 is a front elevational view of the embodiment of FIG. 1.

A vacuum manipulator assembly 34 can be positioned adjacent the support member 28, and can include a tubular member configured as a manipulator member 36. The tubular manipulator member 36 can include a relatively small diameter tubular member configured as a needle tip member 38 at one end portion thereof. For example, in some embodiments, a diameter of the needle tip member 38 can be from 0.05 mm to 1 mm. As best shown in FIGS. 3-5, the needle tip member 38 can be curved or bent such that at least a portion of the lumen of the needle tip member is oriented along the axis 24.

The vacuum manipulator assembly 34 can be configured such that the needle tip member 38 is movable along the axis 24 between a first position (FIGS. 1 and 2) and a second position in the directions indicated by double-headed arrow 35 (FIG. 3). For example, the manipulator member 36 can be supported by a movable guide assembly 40 (FIG. 2) including a shuttle member 42 movably mounted to a guide configured as a rail member 44. The rail member 44 can be oriented parallel to the axis 24, and can include a first end portion 46 and a second end portion 48. With reference to FIGS. 1 and 2, when the shuttle member 42 is located at the first end portion 46 of the rail member 44, the needle tip member 38 can be located at the first position adjacent the tool 14. When the shuttle member is advanced to the second end portion 48 of the rail member 44 (to the left in FIGS. 1 and 2), the needle tip member 38 can move along the axis 24 to the second position adjacent the tubular guide member 20.

Figure 6:
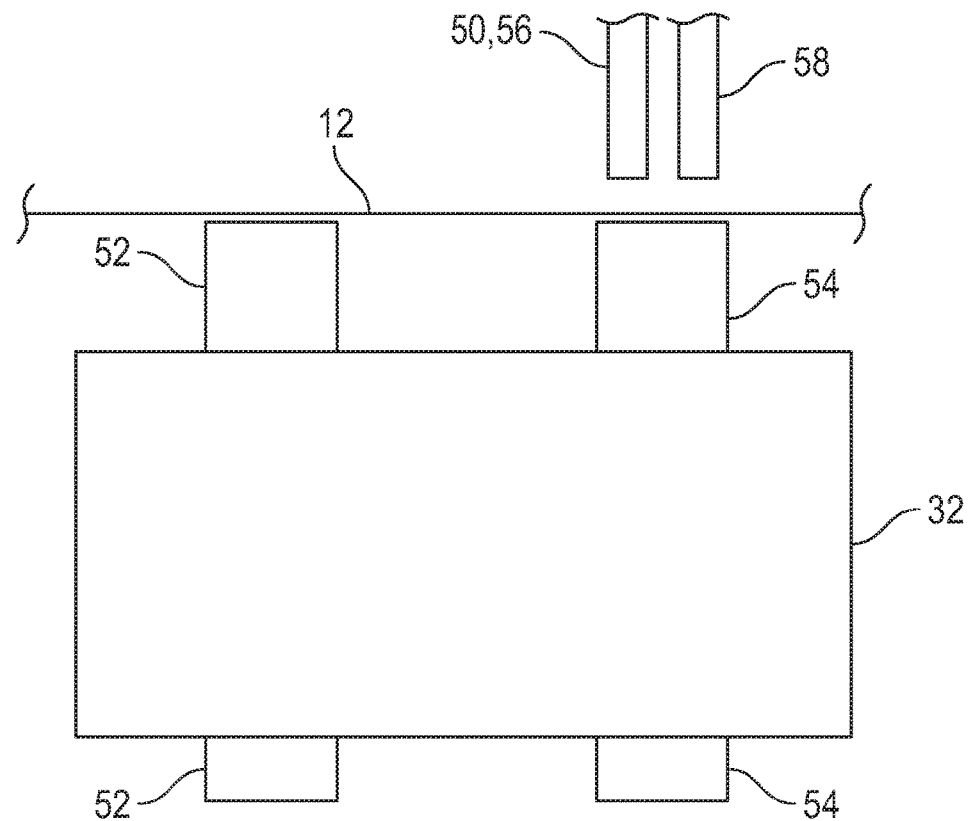
FIG. 6 is a front elevational view of a workpiece including two electrodes and a filament extending between the electrodes.

In certain configurations, the tool 14 can be a welder, such as a parallel gap welder including a welding member or welding head 50 having two electrodes 56, 58 (FIG. 6). The welding head 50 can extend from the tool body such that it is positioned over the workpiece 32. In other embodiments, the tool 14 can be a spot welder, such as an opposed resistance spot welder described in greater detail below with reference to FIG. 9, a soldering iron, a laser welder, or any other suitable tool for securing the filament 12 to the workpiece 32.

In use, the filament 12 can be threaded through the tubular guide member 20, and a vacuum can be applied to the tubular manipulator member 36 from a vacuum source. In certain examples, the pressure within the tubular manipulator member 36 can be from 1 kPa to 100 kPa when the vacuum is drawn through the member. This can allow the vacuum manipulator assembly 34 to manipulate the filament 12 without the filament slipping out from the needle tip member 38, and without damaging the wire. The needle tip member 38 can be moved to the second position adjacent the opening of the tubular guide member 20 by moving the shuttle member 42 to the second end portion 48 of the rail member 44. The vacuum can draw the end of the filament 12 at least partially within the lumen of the needle tip member 38. With the filament 12 engaged with the needle tip member 38 by the vacuum, the needle tip member 38 can be moved back toward the first position by moving the shuttle member 42 along the rail member 44 toward the first end portion 46 such that the filament 12 is drawn from the spool 16, through the tubular guide member 20, and along the axis 24 toward the workpiece 32.

FIG. 6 illustrates the workpiece 32 in greater detail. In the illustrated embodiment, the workpiece 32 is an exploding-bridgewire detonator, and includes two workpiece electrodes 52, 54. The assembly 10 can be configured such that as the filament 12 is drawn across the electrodes by the vacuum manipulator assembly 34, the filament can be precisely positioned with respect to and, in certain configurations, in contact with, the workpiece electrodes 52, 54. The welding head 50 can then be applied to the filament 12 to weld the filament to the electrodes 52, 54. The wire tails can then be cut, leaving a portion of the filament extending between the workpiece electrodes 52, 54. The finished workpiece 32 can then be removed from the support member 28, a new workpiece can be positioned on the surface 30, and the process can be repeated. In some embodiments, the system 10 can include one or more optical elements, such as cameras, microscopes, etc., to facilitate placement of the filament 12 on the workpiece by an operator. For example, FIG. 4 illustrates a microscope 60 aimed at the surface 30 of the support member 28, which may be used by an operator when using the system 10.

Figure 7:
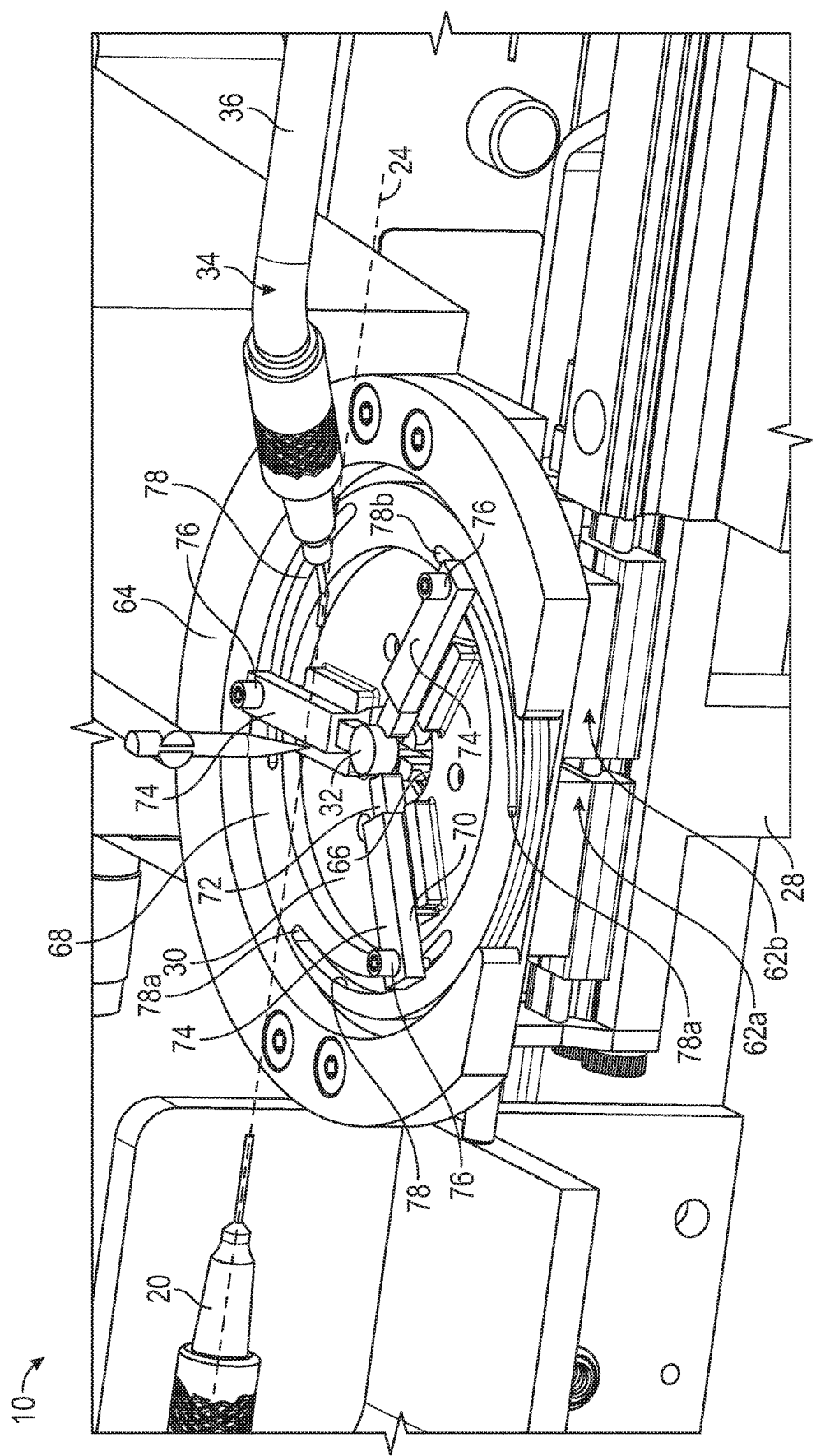
FIG. 7 is a perspective view of a portion of an exemplary embodiment of a system for manipulating a filament.
Figure 8:
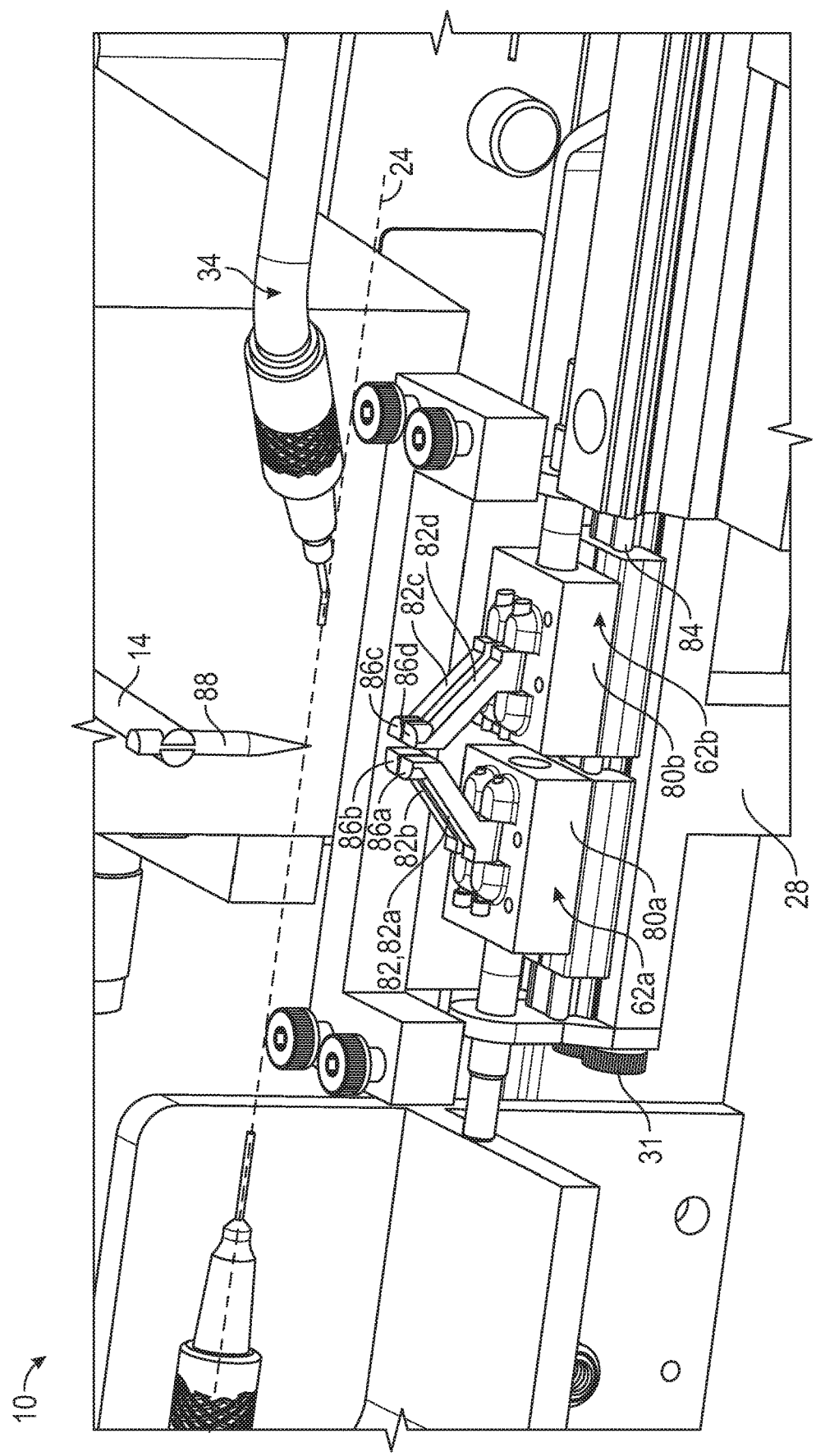
FIG. 8 is a perspective view of the system of FIG. 7 with the chuck removed for purposes of illustration.
Figure 9:
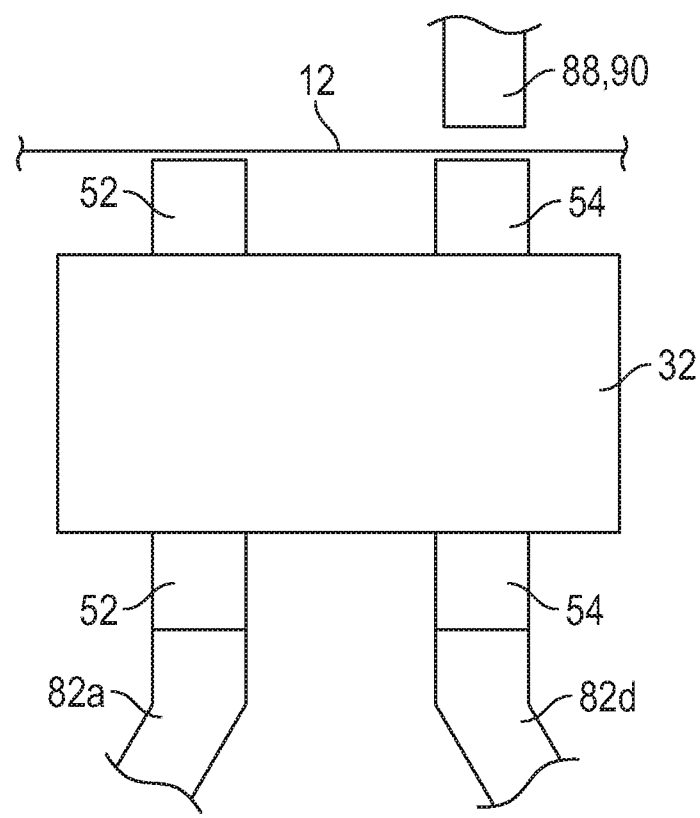
FIG. 9 is a front elevational view of a workpiece including two electrodes and a filament extending between the electrodes.

FIGS. 7-9 illustrate another embodiment of system 10, wherein the support member 28 includes an electrode assembly 62 (FIG. 8), and a mounting mechanism 64 connected to a surface 30.

In the illustrated embodiment, surface 30 has an aperture 66 at its geometric center, over which workpiece 32 can be positioned using the mounting mechanism 64. As shown in FIG. 7, the mounting mechanism 64 can comprise a rotatable chuck 68 and a plurality of extendable members 70. Each extendable member 70 can generally comprise an inner member 72 and an outer member 74 configured to receive the inner member 72. The inner and outer members 72, 74 can be movable longitudinally relative to each other in a telescoping manner. In the illustrated embodiment, the mounting mechanism 64 comprises three extendable members 70 spaced circumferentially around the central aperture 66 of the surface 30. However, in other embodiments, a greater or fewer number of extendable members 70 can be used.

The extendable members 70 can be operatively coupled to the rotatable chuck 68 such that rotation of the chuck 68 in a first direction (e.g., in a clockwise direction) causes the inner members 72 to advance radially inward toward the center of the surface 30, and rotation of the chuck 68 in a second direction (e.g., in a counterclockwise direction)

causes the inner members 72 to retract radially outward toward the edge of the surface 30.

The extendable members 70 can be coupled to the chuck 68 using one or more fasteners 76 (e.g., pins or rivets). Each fastener 76 can be situated within a groove 78 of the chuck 68 such that the chuck 68 rotates a predetermined amount before a first end portion 78a or second end portion 78b of the groove 78 abuts the fastener 76. The length of the grooves 78 can define the rotational range of motion of the chuck 68, and thereby the linear range of motion of the respective extendable members 70.

In use, a workpiece 32 can be positioned over aperture 66. The rotatable chuck 68 can be rotated in a first direction, advancing the inner members 72 of the extendable members 70 until they abut the workpiece 32 at circumferentially spaced locations, securing the workpiece 32 in a selected position over the opening 66. In the illustrated embodiment, the mounting mechanism 64 can be used to secure the workpiece 32 in a three-point grip. Once the workpiece 32 is secured in position, the filament 12 can be drawn across the workpiece electrodes 52, 54 using the vacuum manipulator assembly 34, as described in detail above.

Referring now to FIG. 8, the support member 28 can include an electrode assembly including a first electrode 62a and a second electrode 62b. The position of the support member 28, and thus the position of the electrodes 62a and 62b, can be adjustable relative to the other components of the system in the X-, Y-, and/or Z-axes using knobs 31. The electrodes 62a and 62b can comprise respective shuttle members 80a and 80b, and one or more angled members 82 (e.g., two in the illustrated embodiment) coupled to each of the shuttle members 80a and 80b. The shuttle members 80a and 80b can be formed from an electrically conductive metal (e.g., a copper, aluminum, or steel alloy), and can be movably mounted to a guide configured as a rail member 84. The rail member 84 can be oriented parallel to the axis 24. The shuttle members 80a and 80b, and thus the respective angled members 82, can move in any direction, including along the z-axis to locate the angled members within the aperture 66, and along the x-axis to vary the distance between the members 82 of shuttle 80a and the members 82 of shuttle 80b (e.g., to accommodate differently sized workpieces or workpieces having differently spaced electrodes).

In the illustrated embodiment, each shuttle member 80a and 80b can comprise a set of two angled members 82 disposed adjacent one another and extending upwardly parallel to each other at an angle from the respective shuttle member 80. For example, the shuttle member 80a can comprise two angled members 82a and 82b adjustably and/or releasably coupled to the shuttle member 80a, and the shuttle member 80b can comprise two angled members 82c and 82d adjustably and/or releasably coupled to the shuttle member 80b. Each angled member 82 can comprise a contact surface 86 configured such that the contact surface is perpendicular with respect to the axis 24. Thus, the member 82a can comprise a contact surface 86a, the member 82b can comprise a contact surface 86b, the member 82c can comprise a contact surface 86c, and the member 82d can comprise a contact surface 86d. The contact surfaces 86a, 86b, 86c, and 86d can be co-planar. In certain embodiments, the members 82a-82d can comprise a conductive metal, such as a copper, aluminum, or steel alloy, similar to the shuttle members 80a and 80b.

Referring to FIGS. 8 and 9, the contact surfaces 86a and 86b can align with, and can selectively be brought into contact with, workpiece electrode 52 (e.g., the workpiece 32 can be mounted in the chuck such that the workpiece electrode 52 extends between the surfaces 86a and 86b). The contact surfaces 86c and 86d can align with, and can be selectively brought into contact with, the workpiece electrode 54. The electrodes 62a and 62b can be used: (i) as second or bottom electrodes during opposed resistance welding, and (ii) to measure the resistance of the completed assembly of the workpiece 32 and the filament 12.

In the configuration illustrated in FIGS. 7-10, the tool 14 can be configured as an opposed resistance spot welder. As shown in FIG. 9, the tool 14 can include a welding head 88 having an electrode 90. As described above with respect to FIGS. 1-6, the workpiece 32 can be an exploding-bridgewire detonator including two electrodes 52, 54. In certain embodiments, the workpiece electrodes 52, 54 can extend through the body of the workpiece 32 (see FIG. 9), and can extend in a direction perpendicular to axis 24. The body of the workpiece 32 can comprise, for example, thermoplastic or other material configured to keep the workpiece electrodes 52 and 54 electrically isolated from the body.

Using the vacuum manipulator assembly 34, the filament 12 can be drawn across the workpiece electrodes 52, 54. The welding head 88 can then be applied to the filament 12 at the upper surface of each workpiece electrode 52, 54. Each electrode 62a and 62b can serve as the second or bottom electrode for welding the filament 12 to the respective contact 52 or 54 of the workpiece 32 in an opposed gap spot welding procedure. For example, the first electrode 62a can serve as the bottom electrode when weld head 88 is applied to the filament 12 at workpiece electrode 52 (e.g., by contacting the lower surface of the workpiece electrode 52 to provide a path to ground). The electrode 62b can serve as the bottom electrode when weld head 88 is applied to the filament 12 at workpiece electrode 54. Current can pass through electrode 90, through the filament 12 and the respective workpiece electrode 52 or 54, and into the electrode 62a or the electrode 62b to ground in order to weld the filament 12 to the workpiece electrodes 52 and 54. Once the filament 12 is welded, the wire tails can be cut, leaving a portion of filament extending between the workpiece electrodes 52, 54.

Once the filament 12 has been welded to the workpiece 32, the electrode assemblies 62a and 62b can be used to measure the resistance of the assembled detonator 32 without removing the detonator from the chuck. For example, the electrodes 62a and 62b can be used for four-terminal sensing to help take accurate measurements of the resistance. Generally, four-terminal sensing uses separate current (force) and voltage (sense) connections in order to eliminate the lead and contact resistance from the measurement. In the illustrated embodiment, each electrode 62a and 62b can comprise one force contact and one sense contact. For example, in certain embodiments the angled member 82a of the electrode 62a can be configured as a force electrode or contact, and the angled member 82b can be configured as a sense electrode or contact, although the roles may be reversed. With regard to the electrode 62b, the member 82d can be configured as a force electrode or contact, and the member 82c can be configured as a sense electrode or contact.

The electrode assemblies 62a and 62b, and the workpiece 32, can be arranged such that each workpiece electrodes 52, 54 extend between one force electrode and one sense electrode. For example, as illustrated in FIGS. 8 and 9, during resistance measurements the workpiece electrode 52 can contact the surface 86a of the force electrode 82a, and can contact the surface 86b of the sense electrode 82b. Meanwhile, the workpiece electrode 54 can contact the surface 86c of the sense electrode 82c and the surface 86d of the force electrode 82d. While only the front sides of the electrode assembly 62 and the workpiece 32 are depicted in FIG. 9, it should be appreciated that the electrodes 82b and 82c make contact with the electrodes 52 and 54, respectively, in a similar manner to the electrodes 82a and 82d.

A four-terminal sensing measurement can proceed in the following exemplary manner. Current can be supplied via the force electrodes 82a and 82d to generate a voltage drop across the impedance (e.g., the workpiece/filament assembly) to be measured. The sense electrodes 82b and 82c are positioned such that they do not include the voltage drop in the force electrodes 82a and 82d. This allows the sense electrodes 82b, 82c to accurately measure the resistance of the workpiece/filament assembly without including the internal resistance of the measurement device.

Figure 10:
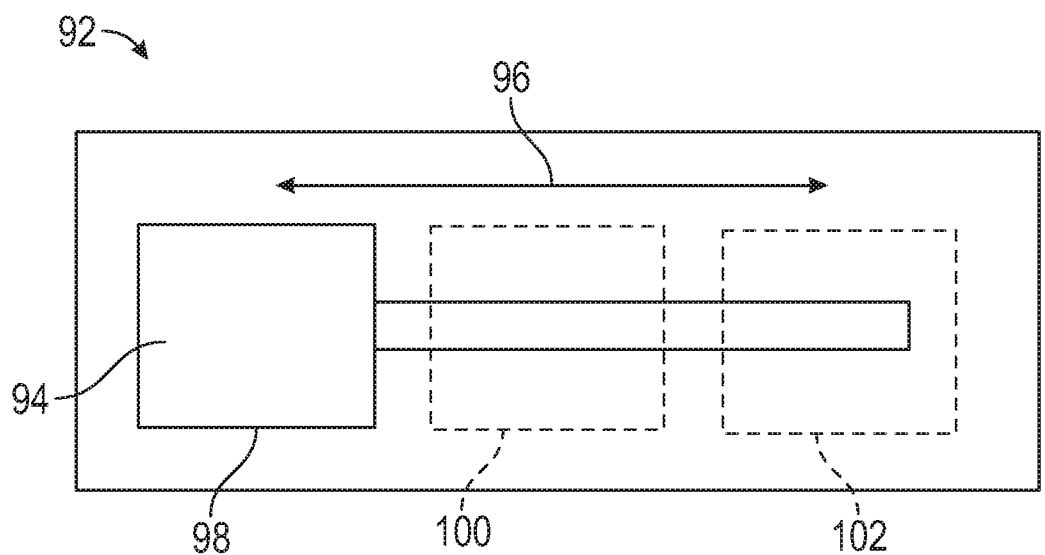
FIG. 10 illustrates an exemplary embodiment of a switch.

Referring now to FIG. 10, the different functions of the system 10 including the electrode assembly 62 can be controlled using a switch 92. In an exemplary embodiment, switch 92 can have a slider 94 movable in the direction of double-headed arrow 96 between a first position 98, a second position 100, and a third position 102. When slider 94 is in the first position 98, the electrode assembly 62a and the welding head 88 of tool 14 can be used to weld the filament 12 to a first workpiece electrode (e.g., the left workpiece electrode 52 in the orientation shown in FIG. 9). When slider 94 is in the second position 100, the electrode assembly 62b and the welding head 88 can be used to weld the filament 12 to a second workpiece electrode (e.g., the right electrode 54 in the orientation shown in FIG. 9). When slider 94 is in the third position 102, the electrodes 62a and 62b can be used to measure the resistance of the workpiece/filament assembly using a four-point resistance measurement, as described above. The switch 92 can also be configured as any other type of switch, such as a three position toggle switch.

The embodiments described herein can provide significant advantages over known systems and methods for placing filaments such as fine wires and securing or welding them to a workpiece. For example, using existing systems for producing exploding-bridgewire detonators, a worker typically must cut the filament to the required length, position the filament on the electrodes of the detonator, and weld the filament in place all by hand. Using such a system, an experienced worker may produce only two detonators per hour. However, using the systems and methods described herein, a user with relatively little experience can produce 20 detonators per hour, or 10 times more than with existing manual methods. Moreover, because the components are precisely positioned relative to each other on the frame 18 and the support stage 26, filaments can be repeatably placed within positional tolerances of one thousandth of an inch (i.e., 0.001 inch).

Additionally, the vacuum manipulator assembly 24 allows extremely thin wire to be manipulated and placed with great positional accuracy, and without damaging the wire or altering its dimensions. For example, by application of appropriate vacuum, the vacuum manipulator assembly 34 can draw the wire from the spool 16 without gripping the wire. Gripping or contacting wire of such small size can easily affect the wire's diameter, an important dimension that affects the timing of the detonator. Wires that are damaged or have diameters altered beyond strictly specified tolerances are associated with a relatively high number of units that are rejected for failure to meet quality control requirements in existing detonator production methods.

The systems and methods described herein can be useful in other explosive or gas generation applications, such as in igniters for gas generation modules in automobile airbags. The disclosed systems and methods can also be applicable to the manufacture of other devices requiring precise and accurate positioning and fixation of extremely fine wires, such as electrical interconnects in semiconductor fabrication.

GENERAL CONSIDERATIONS

For purposes of this description, certain aspects, advantages, and novel features of the embodiments of this disclosure are described herein. The disclosed methods, apparatus, and systems are not limiting in any way. Instead, the present disclosure is directed toward all novel and nonobvious features and aspects of the various disclosed embodiments, alone and in various combinations and sub-combinations with one another. The methods, apparatus, and systems are not limited to any specific aspect or feature or combination thereof, nor do the disclosed embodiments require that any one or more specific advantages be present or problems be solved. The scope of this disclosure includes any features disclosed herein combined with any other features disclosed herein, unless physically impossible.

Although the operations of some of the disclosed embodiments are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

As used in this application and in the claims, the singular forms "a," "an," and "the" include the plural forms unless the context clearly dictates otherwise. Additionally, the term "includes" means "comprises." Further, the terms "coupled" and "associated" generally mean electrically, electromagnetically, and/or physically (e.g., mechanically or chemically) coupled or linked and does not exclude the presence of intermediate elements between the coupled or associated items absent specific contrary language.

In some examples, values, procedures, or apparatus may be referred to as "lowest," "best," "minimum," or the like. Such descriptions are intended to indicate that a selection among many alternatives can be made, and such selections need not be better, smaller, or otherwise preferable to other selections.

In the description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Unless otherwise indicated, all numbers expressing quantities of components, molecular weights, percentages, temperatures, times, and so forth, as used in the specification or claims are to be understood as being modified by the term "about." Accordingly, unless otherwise indicated, implicitly or explicitly, the numerical parameters set forth are approximations that can depend on the desired properties sought and/or limits of detection under test conditions/methods familiar to those of ordinary skill in the art. When directly and explicitly distinguishing embodiments from discussed prior art, the embodiment numbers are not approximates unless the word "about" is recited. Furthermore, not all alternatives recited herein are equivalents.

In view of the many possible embodiments to which the principles of the disclosed technology may be applied, it should be recognized that the illustrated embodiments are only preferred examples and should not be taken as limiting the scope of the disclosure. Rather, the scope of the disclosure is at least as broad as the following claims.

The invention claimed is:

1. A system for manipulating a filament, comprising:
a filament supply from which the filament can be drawn;
a vacuum manipulator assembly including a tubular manipulator member having a needle tip member coupled to an end portion thereof, the tubular manipulator member being movable along an axis between a first position and a second position;
a tubular guide member located between the filament supply and the vacuum manipulator assembly and through which the filament can be drawn, the tubular guide member being positioned such that a lumen of the tubular guide member is oriented along the axis;
a welding tool including a welding head positioned along the axis between the tubular guide member and the vacuum manipulator assembly, the welding tool being configured to weld the filament to a workpiece;
wherein the vacuum manipulator assembly is configured such that when the tubular manipulator member is at the second position, the needle tip member is located adjacent the tubular guide member and configured to engage the filament when a vacuum is drawn through the tubular manipulator member; and
wherein the vacuum manipulator assembly is further configured such that motion of the tubular manipulator member toward the first position draws the filament along the axis from the filament supply, through the tubular guide member, and to the workpiece for welding by the welding tool.

2. The system of claim 1, wherein the tubular manipulator member is coupled to a guide assembly comprising a shuttle member movably mounted to a rail member such that motion of the shuttle member along the rail member produces corresponding motion of the needle tip member along the axis between the first position and the second position.

3. The system of claim 1, further comprising:
an electrode assembly comprising a first electrode having a first angled member and a second electrode having a second angled member, the first and second electrodes being spaced apart from the welding tool such that a workpiece can be positioned between the welding tool and the electrodes;
wherein the first angled member extends toward the welding head and comprises a first contact surface;
wherein the second angled member extends toward the welding head and comprises a second contact surface; and
wherein the first and second contact surfaces are spaced apart from one another along the axis.

4. The system of claim 3, wherein the first electrode comprises a third angled member adjacent the first angled member, the third angled member extending toward the welding head and comprising a third contact surface;
wherein the second electrode comprises a fourth angled member adjacent the second angled member, the fourth angled member extending toward the welding head and comprising a fourth contact surface; and
wherein the third and fourth contact surfaces are spaced apart from one another along the axis.

5. The system of claim 4, wherein the electrode assembly is configured to measure a resistance across the filament and the workpiece when the filament is welded to the workpiece.

6. The system of claim 1, wherein the workpiece is an exploding-bridgewire detonator.

7. The system of claim 1, wherein the welding head comprises two adjacent welding electrodes configured to perform parallel gap welding.

8. A system, comprising:
a filament supply from which a filament can be drawn, the filament supply being positioned along an axis;
a vacuum manipulator assembly positioned along the axis, wherein the vacuum manipulator assembly is configured to engage the filament when a vacuum is drawn through the vacuum manipulator assembly and draw the filament along the axis to a workpiece;
a welding tool comprising a welding head positioned along the axis between the filament supply and the vacuum manipulator assembly, the welding tool being configured to weld the filament to the workpiece;
an electrode assembly comprising a first electrode having a first angled member and a second electrode having a second angled member, the first and second electrodes being spaced apart from the welding tool such that a workpiece can be positioned between the welding tool and the electrodes;
wherein the first angled member extends toward the welding head and comprises a first contact surface;
wherein the second angled member extends toward the welding head and comprises a second contact surface; and
wherein the first and second contact surfaces are spaced apart from one another along the axis.

9. The system of claim 8, wherein the first electrode comprises a third angled member adjacent the first angled member, the third angled member extending toward the welding head and comprising a third contact surface
wherein the second electrode comprises a fourth angled member adjacent the second angled member, the fourth angled member extending toward the welding head and comprising a fourth contact surface; and
wherein the third and fourth contact surfaces are spaced apart from one another along the axis; and
wherein the electrode assembly is configured to measure a resistance across the filament and the workpiece when the filament is welded to the workpiece.

10. The system of claim 9, wherein the electrode assembly is configured to use four-point resistance measurement to measure the resistance.

11. The system of claim 8, wherein the workpiece comprises first and second workpiece electrodes, and wherein the first electrode is configured to selectively contact the first workpiece electrode and the second electrode is configured to selectively contact the second workpiece electrode.

12. The system of claim 8, further comprising:
a switch movable between first, second, and third positions;
wherein when the switch is in the first position, the system is configured to weld the filament to the first workpiece electrode;
wherein when the switch is in the second position, the system is configured to weld the filament to the second workpiece electrode; and wherein when the switch is in the third position, the system is configured to measure the resistance across the filament and the workpiece.

13. The system of claim 8, wherein the welding tool is configured to weld the filament to the workpiece using at least one of the first electrode and the second electrode.

14. The system of claim 8, wherein the workpiece is an exploding-bridgewire detonator.

15. The system of claim 8, further comprising a mounting assembly configured to position the workpiece along the axis and adjacent the welding tool.

16. The system of claim 15, wherein the mounting assembly comprises a plurality of extendable members configured to abut and hold the workpiece between the welding tool and the electrode assembly.

17. A method, comprising:
inserting a filament from a filament supply through a tubular guide member oriented along an axis;
applying a vacuum to a tubular manipulator member of a vacuum manipulator assembly;
moving the tubular manipulator member such that a needle tip member of the tubular manipulator member moves along the axis from a first position adjacent a welding tool to a second position adjacent the tubular guide member such that an end portion of the filament is drawn into the needle tip member by the vacuum;
moving the tubular manipulator member back to the first position such that the filament is drawn from the filament supply, through the tubular guide member, and along the axis by the needle tip member to a workpiece positioned along the axis adjacent the welding tool; and
welding the filament to the workpiece.

18. The method of claim 17, wherein moving the tubular manipulator member further comprises moving a shuttle member to which the tubular manipulator member is coupled along a rail member, the rail member being oriented parallel to the axis.

19. The method of claim 17, further comprising measuring a resistance through the filament and the workpiece using an electrode assembly comprising a first electrode having a first angled member comprising a first contact surface and a second electrode having a second angled member comprising a second contact surface.

20. The method of claim 17, wherein welding the filament to the workpiece comprises using a welding head of the welding tool in combination with an electrode assembly comprising a first electrode and a second electrode.

* * * * *